United States Patent
Jacobs et al.

(10) Patent No.: US 11,535,945 B2
(45) Date of Patent: Dec. 27, 2022

(54) IMMERSION PLATING TREATMENTS FOR INDIUM PASSIVATION

(71) Applicant: TEXAS INSTRUMENTS INCORPORATED, Dallas, TX (US)

(72) Inventors: Simon Joshua Jacobs, Lucas, TX (US); Kathryn Anne Schuck, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/731,788

(22) Filed: Dec. 31, 2019

(65) Prior Publication Data

US 2021/0198798 A1 Jul. 1, 2021

(51) Int. Cl.
| | |
|---|---|
| *B32B 15/01* | (2006.01) |
| *C25D 3/12* | (2006.01) |
| *C25D 3/48* | (2006.01) |
| *C25D 7/12* | (2006.01) |
| *C23C 18/08* | (2006.01) |
| *C23C 18/32* | (2006.01) |
| *C23C 18/42* | (2006.01) |
| *H01L 21/768* | (2006.01) |
| *C23C 18/16* | (2006.01) |
| *C25D 3/46* | (2006.01) |

(52) U.S. Cl.
CPC .............. *C25D 3/12* (2013.01); *B32B 15/018* (2013.01); *C23C 18/08* (2013.01); *C23C 18/1637* (2013.01); *C23C 18/32* (2013.01); *C23C 18/42* (2013.01); *C25D 3/48* (2013.01); *C25D 7/12* (2013.01); *H01L 21/76873* (2013.01); *H01L 21/76874* (2013.01); *C25D 3/46* (2013.01)

(58) Field of Classification Search
CPC ............................... C23C 22/00; B32B 15/018
See application file for complete search history.

(56) References Cited

U.S. PATENT DOCUMENTS 3,367,754 A * 2/1968 Dugan .................... H01B 1/02
428/642

* cited by examiner

*Primary Examiner* — Adam Krupicka
(74) *Attorney, Agent, or Firm* — Michelle F. Murray; Frank D. Cimino

(57) ABSTRACT

A bonding structure formed on a substrate includes an indium layer and a passivating nickel plating formed on the indium layer. The nickel plating serves to prevent a reaction involving the indium layer.

20 Claims, 3 Drawing Sheets

IMMERSION PLATING TREATMENTS FOR INDIUM PASSIVATION

BACKGROUND

Indium is desirable for many reasons in hermetic microelectronic device packaging. Indium is a ductile and low-melting base metal which enables very low temperature sealing, for example, in wafer-to-wafer bonding within a hermetically sealed cavity of micro-electro-mechanical systems (MEMS) packages. However, indium is also a highly reactive metal leading to deleterious effects when placed within a cavity of a microelectronic device package. Thus, in order to solve this problem, it is desirable to provide a method of passivating indium against chemical reactions with an environment below indium's melting point, such that the impact of such chemical reactions on the microelectronic device package may be eliminated or minimized. Advantages of the present invention will become more fully apparent from the detailed description of the invention hereinbelow.

SUMMARY

In one aspect, a bonding structure formed on a substrate includes an indium layer and a passivating nickel plating formed on the indium layer. The nickel plating serves to prevent a reaction involving the indium layer.

In another aspect, a method of preventing a reaction involving an indium layer includes forming a bonding structure on a substrate where indium from an indium layer is exposed. The method also includes forming a passivating nickel-plating on the indium layer by immersion plating. The nickel plating serves to prevent a reaction between involving the indium layer.

In yet another aspect, a method of fabricating a microelectronic device package includes forming an indium layer and immersing the indium layer within an acidic medium containing nickel cations to form nickel plating on the indium layer. The method also includes positioning the nickel-plated indium layer within, adjacent to, or surrounding a perimeter of a cavity to be formed on a wafer. The nickel plating serves to prevent a reaction between the indium layer and other materials within the cavity.

DETAILED DESCRIPTION

Figure 1A:
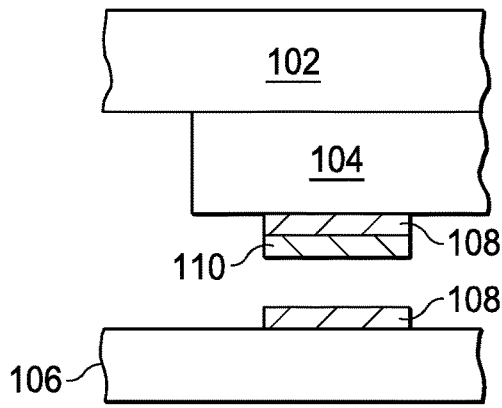
FIGS. 1A and 1B are a schematic cross-sectional side views of a bonding structure.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

For purposes of this description, the terms "film", "coating", and "layer" (and derivatives thereof) may be used interchangeably.

In an aspect, microelectronic device packages are formed concurrently in parallel using a wafer-level packaging strategy that relies in part on a sealing step involving indium as part of the seal. In this approach, at least one of the two or more wafers being bonded to create individual cavities therebetween includes an indium layer having a nickel plating formed thereon. The nickel plating serves to prevent a reaction between the indium layer and other materials within the cavity prior to the ultimate sealing step.

In another aspect, a method of preventing a reaction within a cavity of a microelectronic device package includes forming a number of cavities concurrently in parallel using a wafer-level packaging strategy that relies, in part, on a sealing step involving indium as part of the seal. In this approach, at least one of the two or more wafers being bonded to create individual cavities therebetween includes an indium layer having a nickel plating formed thereon. The nickel plating serves to prevent a reaction between the indium layer and other materials within the cavity prior to the ultimate sealing step.

A variety of metals may be deposited by immersion plating on indium. As indium has a standard redox potential of approximately 0.34V vs. standard hydrogen electrode (SHE) potential, it lies above many other metals in the electrochemical series. Thus, metals such as silver, copper, and gold may all be deposited on indium by immersion plating.

Indium alloys readily even at room temperature with many of these metals. The indium alloy itself may provide a level of passivation of the indium to prevent reaction between metallic indium and the instant environment. However, it is even more desirable to find a metal blocking layer such as nickel which alloys slowly or not at all with indium at room temperature and concurrently does not allow indium or other metals to diffuse through the nickel layer at low temperatures such as room temperature.

Immersion plating is achieved by immersing (literally) a film of a less noble metal in a solution of ions of a more noble metal. In this case, the more noble metal is nickel and the less noble metal is indium. As described below, a fluoroboric (also known as tetrafluoroboric) acid solution is used (i.e., in a separate bath prior to the bath used for the immersion plating of nickel, or in a single bath used also for the immersion plating) in order to selectively remove indium oxide, a native oxide film which can impede or stop the nickel plating reaction.

The thickness of the immersion coating is self-limiting. Once no more indium is exposed to the solution, the replacement process stops, yielding a thin film (typically less than 200 nm) of nickel metal disposed on all previously exposed indium surfaces. Once the immersion reaction is complete, additional nickel may be optionally electroplated to improve the barrier properties.

As alluded to above, one of the challenges of immersion plating on indium with good adhesion while preserving the reactivity of indium is the tenacious surface oxide which firmly forms on indium metal.

Aspects of this description describe the use of acidic immersion solutions with pH <5. This acidic immersion allows for the removal of any indium oxide prior to the immersion deposition/plating of nickel.

The acidic immersion solution used to remove indium oxide may comprise a solution formed by dissolving metal salts such as nickel tetrafluoroborate in combination with many non-oxidizing strong acids such as sulfuric, hydrochloric, phosphoric, and/or tetrafluoroboric acid.

The acidic immersion solution to remove indium oxide may be a separate bath performed prior to the bath used for immersion deposition/plating of nickel, or both process steps may be performed in a single bath. That is, the bath used for immersion plating of nickel may be sufficiently acidic via, for example, inclusion of a non-oxidizing strong acid (such as sulfuric, hydrochloric, phosphoric, and/or tetrafluoroboric acid) so as to remove the indium oxide prior to or simultaneously with the immersion plating of nickel.

Thus, a combination of acidic environment with metal salts is especially useful for immersion plating on indium. In one preferred embodiment, a solution of nickel tetrafluoroborate (~10 g/liter nickel) in dilute tetrafluoroboric acid held at a temperature of 40-50° C. forms a thin but complete immersion coating on indium with a bath exposure time of a few minutes. Optionally, nickel-capped indium may be overcoated with one or more additional metal layers of another more noble metal, such as silver, gold, palladium, platinum, or combinations thereof, which might otherwise react with the indium over time at room temperature. The barrier provided by the nickel layer prevents this reaction. Thus, the presence of nickel prevents the indium from alloying with the more noble metal at temperatures near room temperature. The overcoating process may be electroless plating or electroplating. The overcoating deposited on the nickel immersion coating may also be useful to contain or restrain the indium reactivity.

The nickel interlayer deposited by immersion plating is especially useful in transient liquid phase (TLP) bonding. The nickel layer is thin enough that upon heating the indium to melting, the indium is released to react with other metals in the TLP system. The TLP system may include underlying or overlying metals on the same or different substrate as the indium. In this manner, the indium is protected from reaction with, for instance, acidic components in the packaging environment for substantially all of the temperature cycle involved with making the TLP bond.

It is contemplated that any immersion plated layer (i.e., the nickel plating) may protect part or all of the indium from reaction during the heating involved with the TLP bonding process, but the nickel plating is especially useful in maintaining most of the indium as elemental indium until the indium melts. Thus, the nickel plating prevents chemical reaction of indium in TLP bonding before the indium melts. This reduces unwanted reactions of indium with the underlying metals as well as volatile or corrosive materials that may be present within a cavity of a microelectronic device package (such as lubricant).

This process creates a robust passivation layer (i.e., the nickel plating) which isolates indium from the microelectronic device package cavity and any reactions that may occur during most of the temperature cycle associated with TLP bonding.

This approach requires no additional patterning or lithography to isolate indium from other packaging components within a cavity of a microelectronic device package. It is substantially simpler to implement and results in a lower cost to operate than many alternatives.

Immersion plating used in aspects of this description provide functional, complete, yet very thin layers of passivating metals directly on the indium, and only on the indium.

Figure 1B:
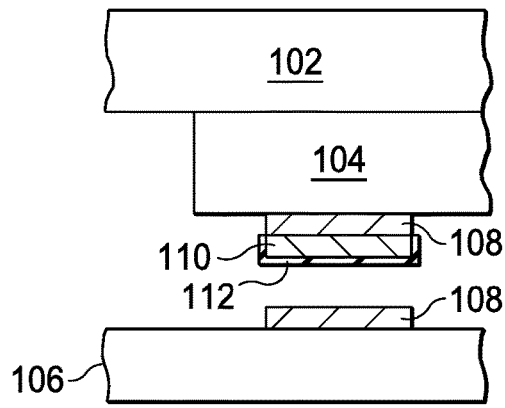

FIGS. 1A and 1B show schematic cross-sectional side views of a bonding structure. FIG. 1A shows sections of a capping wafer/substrate 102, an interposer wafer/substrate 104, and a base device wafer/substrate 106. Gold layers 108 are disposed on facing sides of interposer wafer 104 and base device wafer 106, and indium layer 110 is disposed between the two gold layers 108. In FIG. 1A, the indium layer 110 is exposed to the other components of the structure as well as other device elements and chemicals (not shown). FIG. 1B shows immersion nickel layer 112 of this description which creates a barrier between the indium layer 110 and the other layers/components of the package as well as other device elements and chemicals.

Figure 2A:
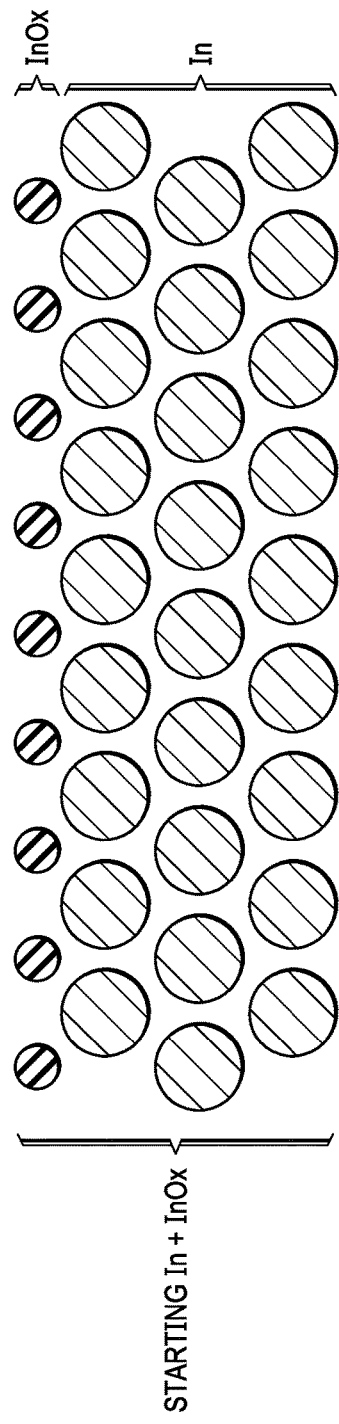
FIGS. 2A-2D are side view schematic steps in a method of fabricating a die for a microelectronic device package, via immersion processing to encapsulate indium.
Figure 2B:
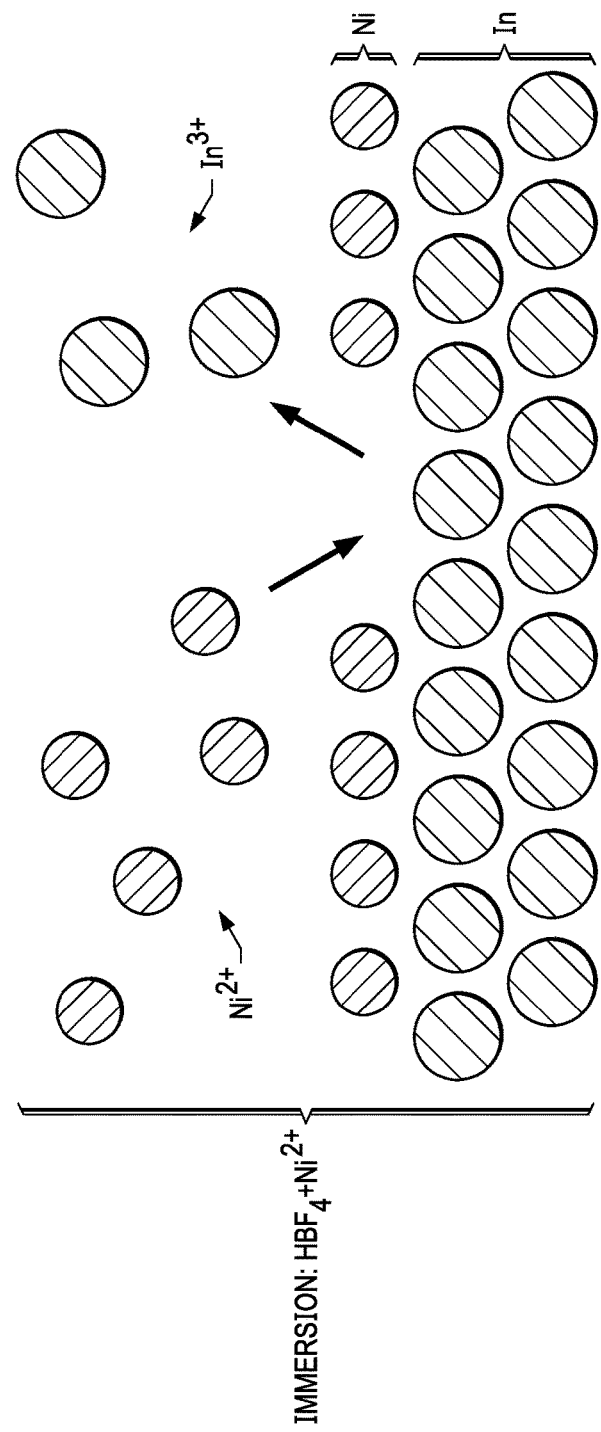
Figure 2C:
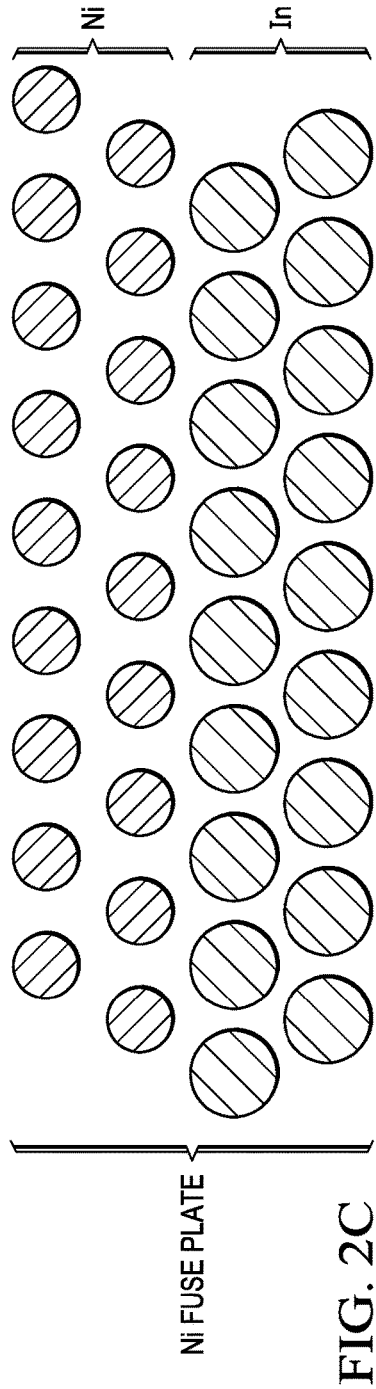
Figure 2D:
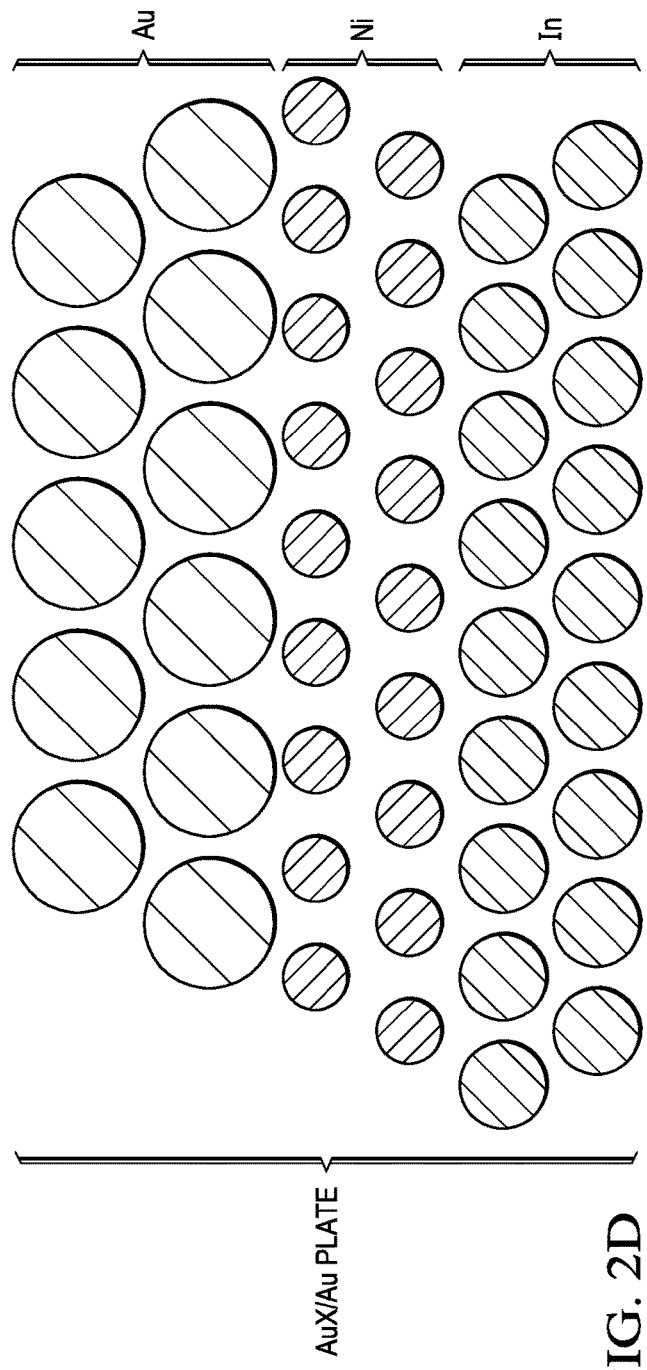

With reference to FIGS. 2A-2D, shown are side view schematic steps in a method of fabricating a die for a microelectronic device package, via inclusion of immersion processing to encapsulate indium. FIG. 2A depicts the initial layer of indium having indium oxide unfortunately formed thereon. FIG. 2B illustrates immersion of an indium layer in an acidic medium (comprising, for example, fluoroboric acid) containing $Ni^{2+}$ cations leading to the immersion plating of nickel on the indium layer as shown in FIG. 2C. FIG. 2D shows an overcoating of a gold layer on the nickel-plated indium layer formed in FIG. 2C.

In one aspect, a microelectronic device package includes a cavity and a die positioned within the cavity. The die includes a nickel-plated indium layer including an indium layer having a nickel plating formed thereon. The nickel plating serves to prevent a reaction between the indium layer and other materials within the cavity (e.g., during the fabrication process).

In an example, the nickel plating is less than 200 nm in thickness. The die may further comprise a noble metal coating on the nickel plating. The noble metal coating comprises at least one noble metal selected from the group consisting of silver, gold, palladium, platinum, and combinations thereof.

Figure 3:
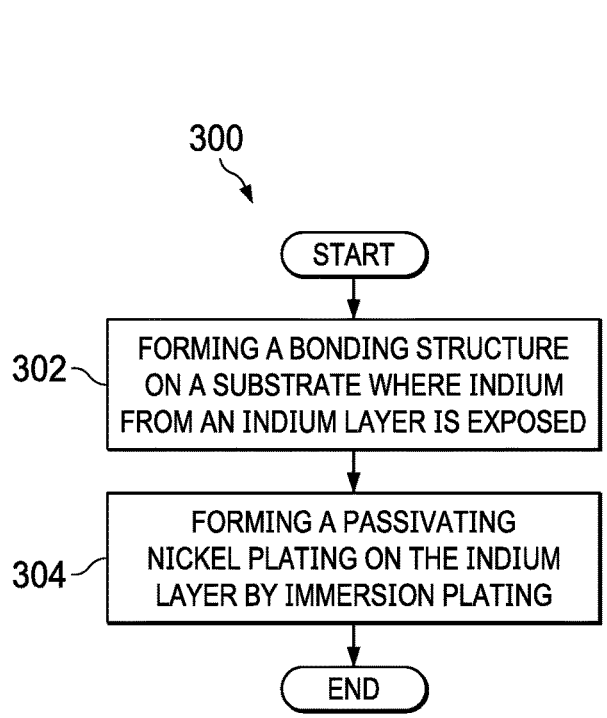
FIG. 3 is a flowchart illustrating a method of preventing a reaction involving an indium layer, in accordance with this description.

With reference to FIG. 3, in another aspect, a method 300 of preventing a reaction within a cavity of a microelectronic device package includes forming a bonding structure on a substrate where indium from an indium layer is exposed (block 302). The method 300 also includes forming a passivating coating on the indium layer by immersion plating (block 304). The passivating coating serves to prevent a reaction involving the indium layer.

In an example of the method, the nickel plating is less than 200 nm in thickness. The die may further comprise a noble metal coating on the nickel plating. The noble metal coating comprises at least one noble metal selected from the group consisting of silver, gold, palladium, platinum, and combinations thereof.

Figure 4:
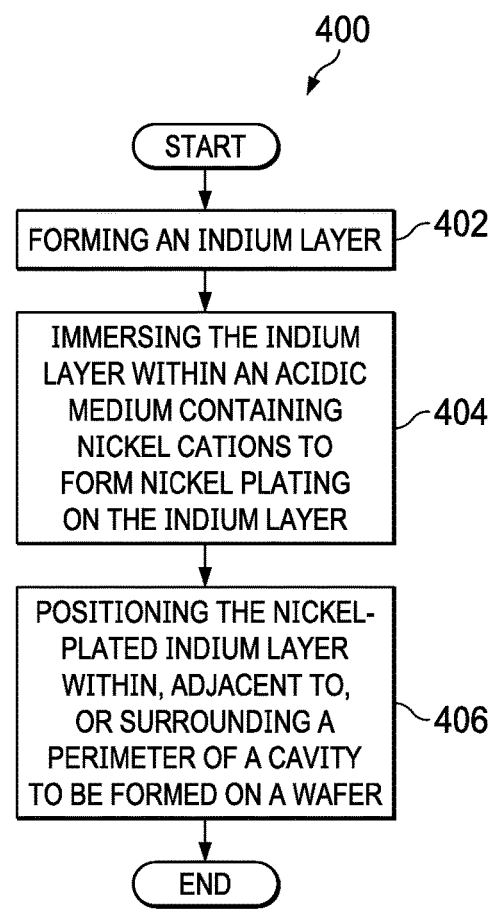
FIG. 4 is a flowchart illustrating a method of fabricating a microelectronic device package, in accordance with this description.

With reference to FIG. 4, in yet another aspect, a method 400 of fabricating a microelectronic device package includes forming an indium layer (block 402) and immersing the indium layer within an acidic medium containing nickel cations to form nickel plating on the indium layer (block 404). The method 400 also includes positioning the nickel-plated indium layer within, adjacent to, or surrounding a perimeter of a cavity of the microelectronic device package (block 406). The nickel plating serves to prevent a reaction between the indium layer and other materials within the cavity of the microelectronic device package.

In an example of the method of fabricating a microelectronic device package, the nickel plating is less than 200 nm in thickness. The method may further comprise sealing the nickel-plated indium layer within the cavity of the microelectronic device package. The acidic medium comprises;

fluoroboric acid; an acidic solution comprising dissolved metal salts; or nickel tetrafluoroborate and a non-oxidizing strong acid selected from the group consisting of sulfuric acid, hydrochloric acid, phosphoric acid, tetrafluoroboric acid, and combinations thereof. The acidic medium is heated to a temperature in the range of 40-50° C. during the immersing.

In an example of the method of fabricating a microelectronic device package, the method may further comprise immersing the indium layer within a solution of pH<5 to remove any indium oxide prior to the immersing of the indium layer within the acidic medium (i.e., in a separate bath). Alternatively, the acidic medium itself may comprise a solution of pH<5 to remove any indium oxide during the nickel plating process. In this latter situation, a single bath would effect the removal of indium oxide as well as the nickel plating of the indium.

In an example of the method of fabricating a microelectronic device package, the method may further comprise coating the nickel plating with a noble metal to form a noble metal coating. The noble metal coating comprises, for example, at least one noble metal selected from the group consisting of silver, gold, palladium, platinum, and combinations thereof. The coating is performed by electroless plating or electroplating.

In an example of the method of fabricating a microelectronic device package, the method may further comprise electroplating additional nickel on the nickel plating, and/or may further comprise subjecting the nickel-plated indium layer to a TLP bonding process within the cavity of the microelectronic device package, wherein the nickel plating further serves to prevent a reaction between the indium layer and other materials within the cavity of the microelectronic device package during heating involved with the TLP bonding process.

In any of the above examples, the indium must be on the substrate prior to receiving the immersion plating treatment. Also, the compositions of the acidic medium (as described above) used for etching/removal of the indium oxide and the acidic medium (as described above) used for the immersion nickel plating may alternatively be interchanged when the etching process and the immersion process are performed in separate baths, as long as the final deposition/immersion medium is sufficiently acidic to ensure that any remaining or newly formed oxide is removed during the immersion process.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this description may be employed in combination with features in other examples described herein, and such combinations are considered to be within the spirit and scope of the present disclosure.

Modifications are possible in the described embodiments, and other embodiments are possible, within the scope of the claims.

What is claimed is:

1. A bonding structure formed on a substrate, the bonding structure comprising:
   a noble metal layer on the substrate;
   an indium layer having a first surface, a second surface opposite the first surface, and side surfaces, the first surface of the indium layer on the noble metal layer; and
   a nickel plating on the second surface and the side surfaces of the indium layer.

2. The bonding structure of claim 1, wherein the nickel plating is less than 200 nm in thickness.

3. The bonding structure of claim 1, wherein the noble metal layer is a first noble metal layer, and the bonding structure further comprises a second noble metal layer on the nickel plating.

4. The bonding structure of claim 3, wherein the noble metal layer comprises gold.

5. The bonding structure of claim 1, wherein the noble metal layer comprises silver, gold, palladium, or platinum.

6. The bonding structure of claim 1, wherein the nickel plating is immersion plated.

7. The bonding structure of claim 1, wherein the nickel plating and the noble metal layer surround the indium layer.

8. A microelectronic device package comprising:
   a first substrate;
   a second substrate; and
   a bond layer between the first substrate and the second substrate, the bond layer around a cavity, the bond layer comprising:
       a noble metal layer on the first substrate;
       an indium layer on the noble metal layer; and
       a nickel plating on the indium layer.

9. The microelectronic device package of claim 8, wherein the noble metal layer comprises gold.

10. The microelectronic device package of claim 8, wherein the noble metal layer is a first noble metal layer, the bond layer further comprising a second metal layer between the nickel plating and the second substrate.

11. The microelectronic device package of claim 8, wherein the first substrate is an interposer and the second substrate is a device substrate, the microelectronic device package further comprising a capping layer contacting the interposer.

12. The microelectronic device package of claim 8, wherein the passivating nickel plating is configured to prevent reaction between the indium layer and materials in the cavity.

13. The microelectronic device package of claim 8, further comprising a die in the cavity.

14. The microelectronic device package of claim 8, wherein the passivating nickel plating is less than 200 nm thick.

15. A microelectronic device package comprising:
    a substrate;
    a noble metal layer on the substrate;
    an indium layer on the noble metal layer; and
    a nickel plating on the indium layer.

16. The microelectronic device package of claim 15, wherein the noble metal layer is a first noble metal layer and the substrate is a first substrate, the microelectronic device package further comprising:
    a second substrate; and
    a second noble metal layer between the second substrate and the nickel plating.

17. The microelectronic device package of claim 15, wherein the noble metal layer comprises gold.

18. The microelectronic device package of claim 15, wherein the nickel plating is immersion plated.

19. The microelectronic device package of claim 15, wherein the nickel plating and the noble metal layer surround the indium layer.

20. The microelectronic device package of claim 15, wherein the nickel plating is less than 200 nm thick.

\* \* \* \* \*